(12) United States Patent
Wang

(10) Patent No.: US 9,742,368 B2
(45) Date of Patent: Aug. 22, 2017

(54) DRIVER

(71) Applicant: Realtek Semiconductor Corporation, Hsinchu (TW)

(72) Inventor: Po-Chih Wang, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/141,831

(22) Filed: Apr. 29, 2016

(65) Prior Publication Data

US 2017/0019077 A1    Jan. 19, 2017

(30) Foreign Application Priority Data

Jul. 14, 2015    (TW) ............................... 104122763 A

(51) Int. Cl.
  *H03F 3/00*    (2006.01)
  *H03F 3/45*    (2006.01)
  *H03F 3/26*    (2006.01)

(52) U.S. Cl.
  CPC ......... *H03F 3/45475* (2013.01); *H03F 3/265* (2013.01); *H03F 2200/534* (2013.01); *H03F 2200/537* (2013.01); *H03F 2200/541* (2013.01)

(58) Field of Classification Search
  CPC ...................................................... H03F 3/00
  USPC .................................. 330/190, 165, 154, 65
  See application file for complete search history.

(56) References Cited

U.S. PATENT DOCUMENTS

| 1,534,172 | A | * | 4/1925 | Field | H03F 1/08 330/117 |
| 1,741,493 | A | * | 12/1929 | Babson | H01F 19/04 330/190 |
| 1,842,190 | A | * | 1/1932 | Ochse | H04M 1/215 324/226 |
| 1,853,106 | A | * | 4/1932 | White | H03F 1/54 330/189 |
| 1,925,224 | A | * | 9/1933 | Alder | H03F 3/02 323/362 |
| 2,245,340 | A | * | 6/1941 | Harvey | H03G 5/26 330/132 |
| 4,490,844 | A | * | 12/1984 | Sohn | H01F 19/00 330/171 |
| 2009/0215414 | A1 | * | 8/2009 | Ikeda | H04B 1/18 455/150.1 |

FOREIGN PATENT DOCUMENTS

JP    2009-206554 A    9/2009

OTHER PUBLICATIONS

Chengzhou Wang et al., "A Capacitance-Compensation Technique for Improved Linearity in CMOS Class-AB Power Amplifiers," IEEE Journal of Solid-State Circuits, vol. 39, No. 11, Nov. 2004.

* cited by examiner

*Primary Examiner* — Henry Choe
(74) *Attorney, Agent, or Firm* — CKC & Partners Co., Ltd.

(57) ABSTRACT

A driver suitable for driving a power amplifier is provided. The driver includes a voltage buffer circuit and a voltage transforming circuit. The voltage buffer circuit receives an input signal, buffers the input signal, and outputs a first output signal. The voltage transforming circuit receives the first output signal and outputs a second output signal to the power amplifier, in which an equivalent inductance of the voltage transforming circuit and an input capacitance of the power amplifier are arranged to make the voltage buffer circuit have a voltage gain approximated to 1.

20 Claims, 5 Drawing Sheets

DRIVER

RELATED APPLICATIONS

This application claims priority to Taiwanese Application Serial Number 104122763, filed on Jul. 14, 2015, which is herein incorporated by reference.

BACKGROUND

Technical Field

The present disclosure relates to a driver. More particularly, the present disclosure relates to the driver for driving a power amplifier.

Description of Related Art

In general, a complete amplifier system may include an input signal converter, a small signal amplifier, a power amplifier and an output signal converter. For example, in a loudspeaker system of a classroom or of a meeting room, a microphone is the input signal converter utilized to convert an audio signal to an electrical signal, and then the small signal amplifier and the power amplifier amplify the electrical signal to drive a speaker, which is the output signal converter.

The small signal amplifier is basically utilized for linearly amplifying the weak electrical signal to make the electrical signal not to be distorted during the transmission to the power amplifier. In order to get the enough power for driving the output signal converter, the power amplifier is basically utilized to make the electrical signal obtain the current gain, and thus the power of the electrical signal is amplified.

However, in the design of the traditional signal amplifier, nonlinear amplification and distortion of the electrical signals are usually caused by the nonlinear characteristics of input capacitance of a transistor in a common source configuration. The traditional method to solve the problem is electrically coupling the transistor with another complementary transistor (e.g., N-type transistors are complementary to P-type transistors), and thus the nonlinear characteristic of the input capacitance can be eliminated by the complementary input capacitance, and the amplification of the electrical signal can be improved. However, the method increases the input capacitance and affects the driving ability of the small signal amplifier.

SUMMARY

The following presents a simplified summary of the disclosure in order to provide a basic understanding to the reader. This summary is not an extensive overview of the disclosure and it does not identify key/critical components of the present disclosure or delineate the scope of the present disclosure. Its sole purpose is to present some concepts disclosed herein in a simplified form as a prelude to the more detailed description that is presented later.

In one aspect, the present disclosure is to provide a driver suitable for driving a power amplifier. The driver includes a voltage buffer circuit and a voltage transforming circuit. The voltage buffer circuit is configured to receive an input signal, to buffer the input signal, and to output a first output signal. The voltage transforming circuit is configured to receive the first output signal and to output a second output signal to the power amplifier, in which an equivalent inductance of the voltage transforming circuit and an input capacitance of the power amplifier are arranged to make the voltage buffer circuit have a voltage gain approximated to 1.

In another aspect, the present disclosure is to provide a driver suitable for driving a power amplifier. The driver includes a transistor and a transformer. The transistor has a control terminal configured to receive an input signal, a first terminal configured to receive a reference voltage, and a second terminal configured to output a first output signal. The transformer, electrically coupled with the second terminal of the transistor and the power amplifier, is configured to receive the first output signal and to output a second output signal to the power amplifier, in which an equivalent inductance of the transformer and an input capacitance of the power amplifier are arranged to make the transistor have a voltage gain approximated to 1.

In still another aspect, the present disclosure is to provide a driver suitable for driving a power amplifier. The driver includes a first transistor, a second transistor, a first coupling capacitor, a second coupling capacitor and a transformer. The first transistor has a control terminal configured to receive a first input signal, a first terminal configured to receive a reference voltage, and a second terminal configured to output a first output signal. The second transistor has a control terminal configured to receive a second input signal, a first terminal configured to receive the reference voltage, and a second terminal configured to output a second output signal. The first coupling capacitor has a first terminal electrically coupled with the control terminal of the first transistor and a second terminal electrically coupled with the second terminal of the second transistor. The second coupling capacitor has a first terminal electrically coupled with the control terminal of the second transistor and a second terminal electrically coupled with the second terminal of the first transistor, in which a capacitance of the first coupling capacitor is an input capacitance of the first transistor, and a capacitance of the second coupling capacitor is an input capacitance of the second transistor. The transformer is electrically coupled with the second terminal of the first transistor, the second terminal of the second transistor and the power amplifier. The transformer is configured to output a third output signal to the power amplifier according to the first output signal and the second output signal, in which an equivalent inductance of the transformer and an input capacitance of the power amplifier are arranged to make the first transistor and the second transistor have a voltage gain approximated to 1.

The present disclosure relates to a driver. More particularly, the present disclosure relates to the driver for driving a power amplifier. By replacing the common source configuration with the voltage buffer circuit and the voltage transforming circuit of the small signal amplifier disclosed in the present disclosure, the nonlinear amplification and distortion of the electrical signal caused by the nonlinear characteristic of an input capacitance of a transistor in a common source configuration can be prevented. Furthermore, the voltage buffer circuit can be stabilized by setting up the coupling capacitances.

These and other features, aspects, and advantages of the present disclosure will become better understood with reference to the following description and appended claims.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
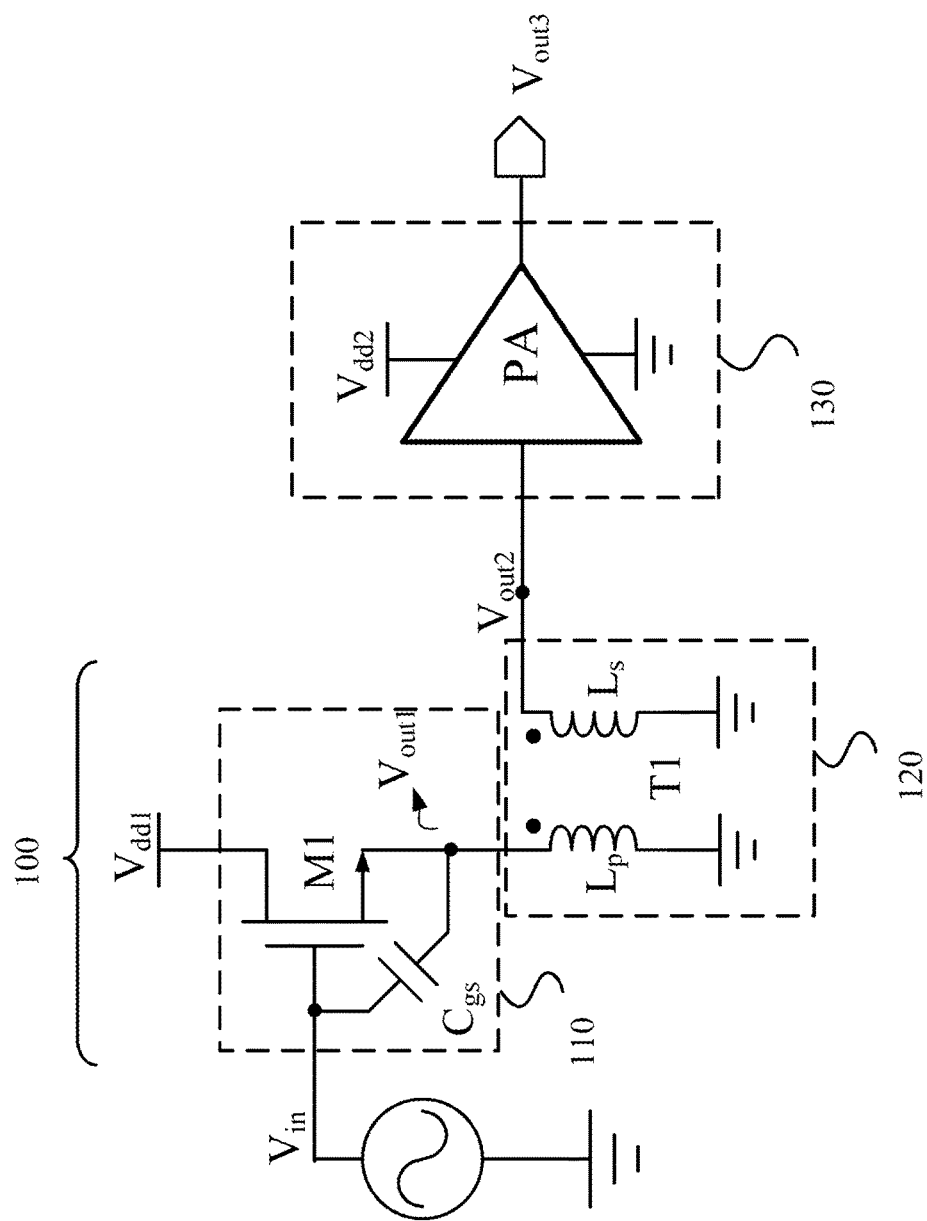
FIG. 1A is a schematic diagram of a driver in accordance with some embodiments of the present disclosure.

Reference is made in detail to the present embodiments of the disclosure, examples of which are illustrated in the accompanying drawings. Wherever possible, the same reference numbers are used in the drawings and the description to refer to the same or like parts.

In the following description and claims, the terms "coupled" and "connected", along with their derivatives, may be used. In particular embodiments, "connected" and "coupled" may be used to indicate that two or more elements are in direct physical or electrical contact with each other, or may also mean that two or more elements may be in indirect contact with each other. The terms "coupled" and "connected" may still be used to indicate that two or more elements cooperate or interact with each other.

Figure 1B:
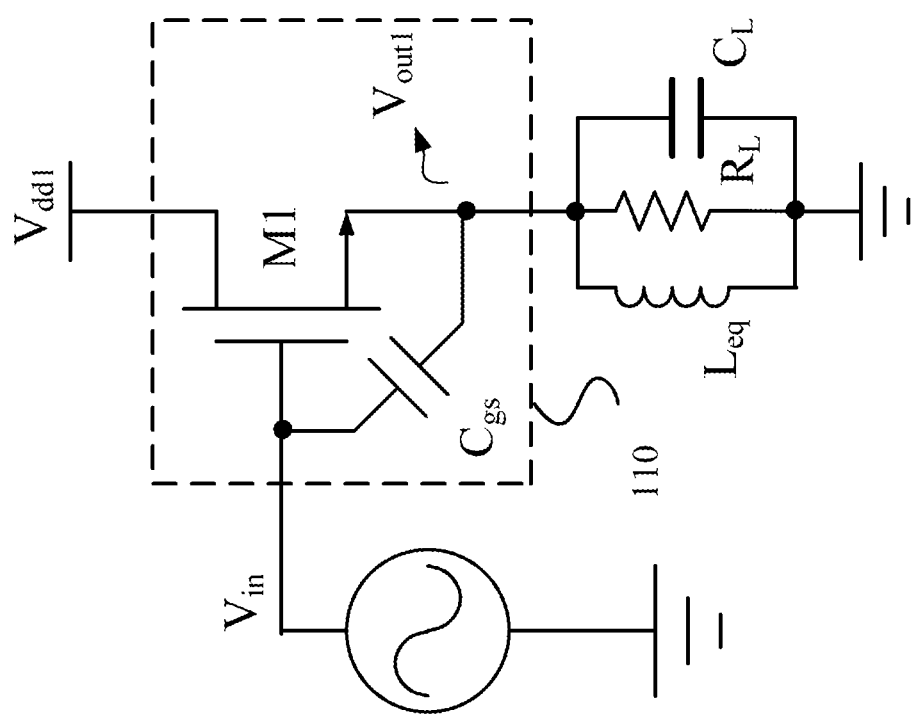
FIG. 1B is a schematic diagram of an equivalent circuit of the driver in FIG. 1A.

Reference is made first to FIG. 1A and FIG. 1B. FIG. 1A is a schematic diagram of a driver 100 in accordance with some embodiments of the present disclosure. FIG. 1B is a schematic diagram of an equivalent circuit of the driver 100 in FIG. 1A. The driver 100 is configured to drive a power amplifier 130. The power amplifier 130 can be utilized in an audio system, a wireless communication system, a mobile phone chip or any electronic apparatus, which is required to be equipped with the power amplifier, and the present disclosure is not limited in this regard.

The driver 100 includes a voltage buffer circuit 110 and a voltage transforming circuit 120. The voltage buffer circuit 110 is configured to receive an input signal $V_{in}$, to buffer the input signal $V_{in}$, and to output a first output signal $V_{out1}$. The voltage transforming circuit 120 is configured to receive the first output signal $V_{out1}$ and to output a second output signal $V_{out2}$ to the power amplifier 130.

In some embodiments, as shown in FIG. 1A, the voltage buffer circuit 110 includes a transistor M1. The transistor M1 has a control terminal configured to receive an input signal $V_{in}$, a first terminal configured to receive a reference voltage $V_{dd1}$, and a second terminal configured to output a first output signal $V_{out1}$. In this embodiment, the transistor M1 is an N-type MOSFET, in practical application, the transistor M1 can be a P-type MOSFET, a BJT or any equivalent transistor, and the present disclosure is not limited in this regard. The input signal $V_{in}$ is an output signal transmitted from a previous stage circuit of the voltage buffer circuit 110, and the previous stage circuit of the voltage buffer circuit 110 can be a piezoelectric circuit for generating audio signals, a transceiver for generating wireless signals or any circuit having the function of processing signals, and the present disclosure is not limited in this regard.

In this embodiment, the input signal $V_{in}$ is smaller than the reference voltage $V_{dd1}$ to make the voltage buffer circuit 110 operate in a linear region. For further explanation, in general, the transistor M1 can be operated in a linear region or a nonlinear region according to the different voltage levels of the input signal $V_{in}$ and of the reference voltage $V_{dd1}$. When the transistor M1 is operated in the linear region, the transistor M1 can linearly buffer the input signal $V_{in}$ to output the first output signal $V_{out1}$, that is to say, all of the waveform of the input signal $V_{in}$ can be transmitted consistently without distortion. On the other hand, when the transistor M1 is operated in the nonlinear region, the transistor M1 may nonlinearly buffer the input signal $V_{in}$ to output the first output signal $V_{out1}$, that is to say, the waveform of the input signal $V_{in}$ is amplified inconsistently, and thus a part of the waveform is distorted, which is regarded as signal distortion. For example, when the voltage level of the input signal $V_{in}$ is about the same as the voltage level of the reference voltage $V_{dd1}$, the transistor M1 is operated in the nonlinear region. When the voltage level of the input signal V is about ⅓ of the voltage level of the reference voltage $V_{dd1}$, the transistor M1 is operated in the linear region, and it should be noted that the value of ⅓ is given illustrative purposes only. In practical application, the voltage level of the input signal $V_{in}$ can be any value which makes the voltage buffer circuit 110 operate in the linear region. By making the voltage buffer circuit 110 be operated in the linear region, the distortion introduced from amplifying the input signal $V_{in}$ to the first output signal $V_{out1}$ can be prevented.

Reference is now made to FIG. 1A, in some embodiments, the voltage transforming circuit 120 includes a transformer T1 electrically coupled with the second terminal of the transistor M1 and the power amplifier 130. The transformer T1 includes a first inductor $L_p$ and a second inductor $L_s$. The first inductor $L_p$ is electrically coupled with the second terminal of the transistor M1, and the second inductor $L_s$ is electrically coupled with the power amplifier 130. The transformer T1 has a turns ratio N $$N = \sqrt{\frac{L_s}{L_p}} = \frac{V_{out2}}{V_{out1}},$$

in which the turns ratio N is a square root of a ratio of inductance of the second inductor $L_s$ to the inductance of the first inductor $L_p$, and is a ratio of the second output signal $V_{out2}$ to the first output signal $V_{out1}$. The turns ratio N can be any integer or positive value, that is to say, the transforming circuit 120 receives the first output signal $V_{out1}$ and outputs the second output signal $V_{out2}$ according to the turns ratio N.

In addition, in this embodiment, the first inductor $L_p$ and the second inductor $L_s$ in the transformer T1 can be regarded as an equivalent inductance $L_{eq}$, which is shown in FIG. 1B. The equivalent inductance of the transformer T1 and an input capacitance $C_L$ of the power amplifier 130 are arranged to make the transistor M1 have a voltage gain approximated to 1. For further explanation, the voltage gain relation between the input signal $V_{in}$ and the first output signal $V_{out1}$ is given by a formula (1) as shown below, $$G_v = \frac{V_{out1}}{V_{in}} = \frac{g_m + j\omega C_{gs}}{g_m + j\omega C_{gs} + j\left(\omega C_L - \frac{1}{\omega L_{eq}}\right) + \frac{1}{R_L}}, \quad (1)$$

in which $g_m$ is a transconductance coefficient of the transistor M1, $C_{gs}$ is an input capacitance of the transistor M1, $L_{eq}$ is the equivalent inductance of the voltage transforming circuit 120, and $R_L$ and $C_L$ are respectively an input resistance and an input capacitance of the power amplifier 130. ω is a variable angular frequency (generally, the angular frequency ω is equal to 2π*f, in which f is a frequency). The waveform of the input signal $V_{in}$ is not limited to be a low frequency variation. When the waveform of the input signal $V_{in}$ has a high frequency variation, it represents the angular frequency ω has a higher value. As shown in the formula (1), the value of the voltage gain $G_v$ is changed according to different values of the angular frequency ω. In this embodiment, the angular frequency ω a first angular frequency $\omega_0$ $$\omega_0 = \frac{1}{\sqrt{L_{eq}C_L}}$$

That is to say, the angular frequency ω is arranged according to the equivalent inductance $L_{eq}$ of the transformer T1 and the input capacitance $C_L$ of the power amplifier 130. Therefore, the voltage gain relation between the input signal $V_{in}$ and the first output signal $V_{out1}$ can be further simplified from the formula (1) to a formula (2).

$$G_v = \frac{V_{out1}}{V_{in}} = \frac{g_m + j\omega_0 C_{gs}}{g_m + j\omega_0 C_{gs} + \frac{1}{R_L}} \qquad (2)$$

As shown in the formula (2), because the angular frequency ω is equal to the first angular frequency $\omega_0$, the equivalent inductance $L_{eq}$ of the voltage transforming circuit 120 cancels out the input capacitance $C_L$ of the power amplifier 130. In addition, the transconductance coefficient $g_m$ of the transistor M1 is generally much larger than $1/R_L$ in the formula (2), i.e., the real part of the denominator and the numerator in the formula (2) is approximated to $g_m$, which makes the value of the voltage gain $G_v$ between the input signal $V_{in}$ and the first output signal $V_{out1}$ equal to 1, and thus the voltage buffer circuit 110 has an unity voltage gain. Therefore, the nonlinear amplification and distortion of the electrical signal caused by the nonlinear characteristic of the input capacitance $C_{gs}$ of the transistor M1 can be prevented. It should be noted that, in some embodiments, the equivalent inductance $L_{eq}$ of the voltage transforming circuit 120 may not totally cancel out the input capacitance $C_L$ of the power amplifier 130, or the input resistance $R_L$ may be small. All of the conditions above can make the value of the voltage gain $G_v$ of the voltage buffer circuit 110 be approximated to 1 (i.e., $G_v \approx 1$), e.g., $G_v=1.05$ or $G_v=0.95$. Therefore, the voltage gain $G_v$ of the voltage buffer circuit 110 is not limited to be the unity voltage gain in the present disclosure, the present disclosure can be utilized in any voltage buffer circuit 110 having a voltage gain approximated to 1.

Figure 1C:
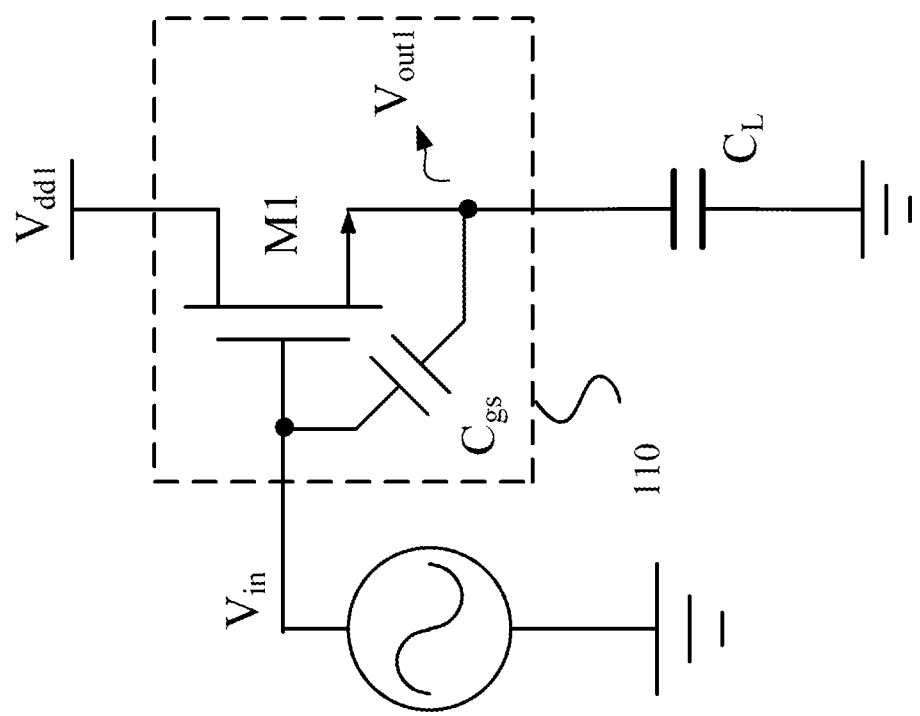
FIG. 1C is a schematic diagram of another equivalent circuit of the driver in FIG. 1A.

Reference is made to FIG. 10. FIG. 1C is a schematic diagram of another equivalent circuit of the driver 100 in FIG. 1A. When the value of the angular frequency ω is increasing, the impedance of the input capacitance $C_L$ of the power amplifier 130 is decreasing, but on the other hand, the impedance of the equivalent inductance $L_{eq}$ of the voltage transforming circuit 120 is increasing. Thus, the input resistance $R_L$ of the power amplifier 130 and the equivalent inductance $L_{eq}$ of the voltage transforming circuit 120 in FIG. 1B can be ignored in the condition that the value of the angular frequency ω is large. Therefore, those illustrated in FIG. 1B can be viewed as the equivalent circuit shown in FIG. 10. In this embodiment, the input impedance $Z_{in}$ of the voltage buffer circuit 110 is given in formulas (3)~(5) in the assumption that the voltage gain $G_v$ of the voltage buffer circuit 110 is 1, i.e., the input signal $V_{in}$ is equal to the first output signal $V_{out1}$)

$$Z_{in} = \frac{V_{in}}{I_{in}} = \frac{V_{out1}}{I_{in}} = \frac{1}{j\omega C_{gs}} + \frac{1}{j\omega C_L} - \frac{g_m}{\omega^2 C_{gs} C_L} \qquad (3)$$

$$\text{Re}\langle Z_{in} \rangle = -\frac{g_m}{\omega^2 C_{gs} C_L} \qquad (4)$$

$$\text{Im}\langle Z_{in} \rangle = -\frac{C_{gs} + C_L}{\omega C_{gs} C_L} \qquad (5)$$

It can be seen that the real part Re<$Z_{in}$> of the input impedance $Z_{in}$ of the voltage buffer circuit 110 is a negative value, and in this condition, the transistor M1 of the voltage buffer circuit 110 may not normally buffer the input signal and output the first output signal $V_{out1}$, such as the oscillation phenomenon of transistors.

Figure 2:
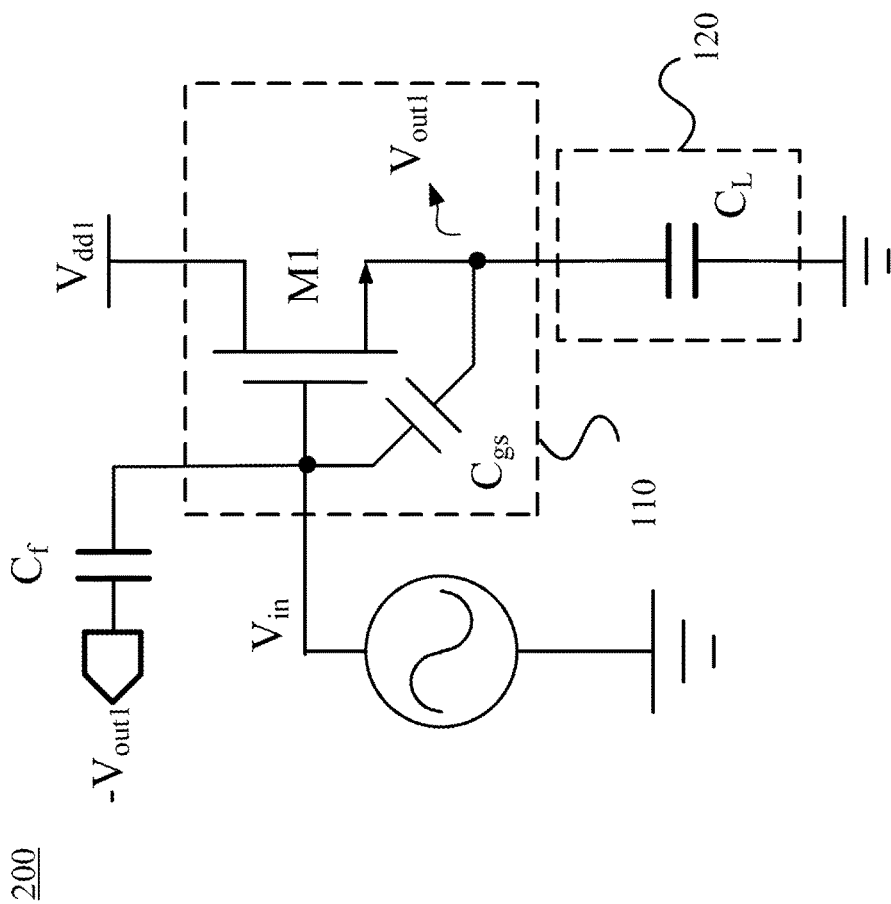
FIG. 2 is a schematic diagram of a driver in accordance with some embodiments of the present disclosure.

Reference is made to FIG. 2. FIG. 2 is a schematic diagram of a driver 200 in accordance with some embodiments of the present disclosure. The driver 200 includes the voltage buffer circuit 110 and the voltage transforming circuit 120 of the driver 100 shown in FIG. 1A. But FIG. 2 only depicts the schematic diagram that the equivalent circuit of FIG. 1C operates with the large value of the angular frequency ω. Compared to the driver 100 shown in FIG. 1C, the driver 200 further includes a coupling capacitor $C_f$. The coupling capacitor $C_f$ has a first terminal electrically coupled with the control terminal of the transistor M1 and a second terminal configured to receive a reversed phase signal $-V_{out1}$, and the coupling capacitor $C_f$ is configured to stabilize the transistor M1, in which the reversed phase signal $-V_{out1}$ is complementary to the first output signal $V_{out1}$. In this embodiment, a capacitance of the coupling capacitor $C_f$ is an input capacitance $C_{gs}$ of the transistor M1.

$$C_f = C_{gs}$$

Therefore, the input impedance $Z_{in}$ of the voltage buffer circuit 110 can be simplified from the formula (5) to a formula (6) as shown below:

$$Z_{in} = \frac{1}{j\omega(2C_{gs})} \qquad (6)$$

As shown in the formula (6), there is no real part exists in the input impedance $Z_{in}$ of the voltage buffer circuit 110, i.e., Re<$Z_{in}$>=0, and thus the transistor M1 can prevent the voltage buffer circuit 110 from outputting the abnormal first output signal $V_{out1}$, i.e., the oscillation phenomenon of transistors.

Figure 3:
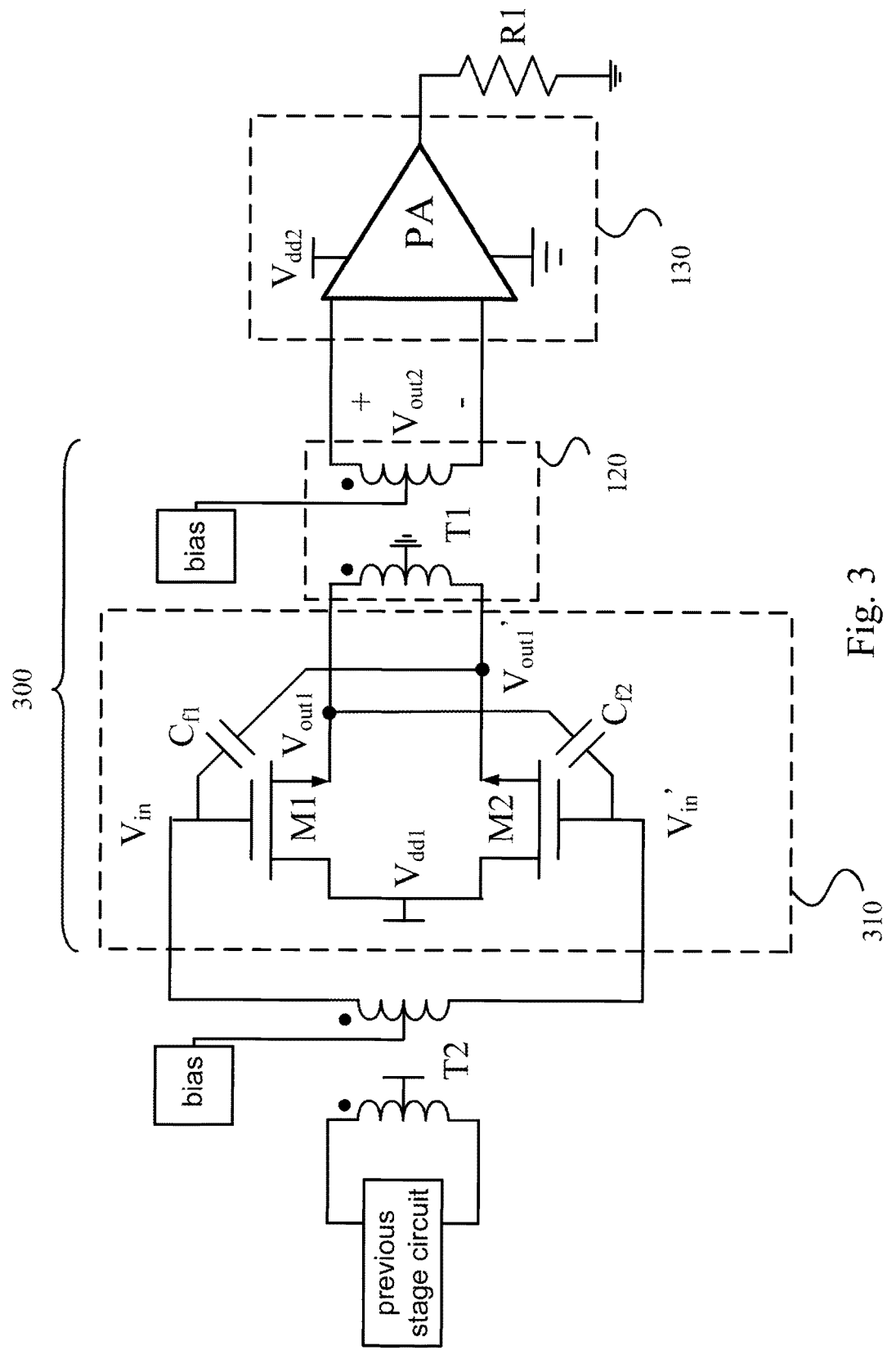
FIG. 3 is a schematic diagram of a driver in accordance with some embodiments of the present disclosure.

In addition, in this embodiment, the reversed phase signal $-V_{out1}$ can be implemented by electrically coupling with an outside signal generator or by coupling two transistors in parallel. Reference is now made to FIG. 3. FIG. 3 is a schematic diagram of a driver 300 in accordance with some embodiments of the present disclosure. The driver 300 includes the voltage transforming circuit 120 of the driver 200 in FIG. 2, and the driver 300 further includes a voltage buffer circuit 310 and coupling capacitors $C_{f1}$ and $C_{f2}$. The voltage buffer circuit 310 includes transistors M1 and M2. As shown in FIG. 3, the transistor M1 and the transistor M2 are coupled with each other in parallel, that is to say, first terminals of the transistors M1 and M2 are both electrically coupled with a reference voltage $V_{dd1}$, and control terminals of the transistors M1 and M2 are both coupled with an input signal source T2, and the input signal source T2 is configured to output input signals $V_{in}$ and $V_{in}$ to the transistors M1 and M2 respectively. In this embodiment, the input signals $V_{in}$ and $V_{in'}$ are complementary to each other. In some embodiments, when the input signals $V_{in}$ and $V_{in'}$ are complementary to each other, those signals are different in phase by about 180 degrees. Therefore, the first output signal $V_{out1}$ and the first output signal $V_{out1'}$, which are respectively outputted by the transistors M1 and M2, are also complementary to each other. By coupling the second terminal of the coupling capacitor $C_{f1}$ with the second terminal of the transistor M2, the second terminal of the coupling capacitor $C_{f1}$ can receive the first output signal $V_{out1'}$, which is complementary to the first output signal $V_{out1}$. Similarly, by coupling the second terminal of the coupling capacitor $C_{f2}$ with the second terminal of the transistor M1, the second terminal of the coupling capacitor $C_{f2}$ can receive the first output signal $V_{out1}$, which is complementary to the first output signal $V_{out1'}$. Therefore, the transistors M1 and M2 in the voltage buffer circuit 310 can prevent the voltage buffer circuit 310 from outputting the abnormal first output signals $V_{out1}$ and $V_{out1'}$, i.e., the oscillation phenomenon of transistors. Then, in the similar way, the received first output signals $V_{out1}$ and $V_{out1'}$ are also transformed by the voltage transforming circuit 120 to the second output signal $V_{out2}$ to the power amplifier 130.

Based on those above, the present disclosure relates to a driver. More particularly, the present disclosure relates to the driver for driving a power amplifier. By replacing the common source configuration of the signal amplifier with the voltage buffer circuit and the voltage transforming circuit, the nonlinear amplification and distortion of the electrical signal caused by the nonlinear characteristic of an input capacitance of a transistor in a common source configuration can be prevented. Furthermore, the voltage buffer circuit can be stabilized by setting up the coupling capacitances.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A driver, suitable for driving a power amplifier, wherein the driver comprises:
   a voltage buffer circuit, configured to receive an input signal, to buffer the input signal, and to output a first output signal; and
   a voltage transforming circuit, configured to receive the first output signal and to output a second output signal to the power amplifier, wherein an equivalent inductance of the voltage transforming circuit and an input capacitance of the power amplifier are arranged to make the voltage buffer circuit have a voltage gain approximated to 1.

2. The driver of claim 1, wherein the voltage buffer circuit is electrically coupled with a reference voltage, and the input signal is smaller than the reference voltage to make the voltage buffer circuit operate in a linear region.

3. The driver of claim 1, wherein the voltage transforming circuit has a turns ratio, and the turns ratio is a ratio of the second output signal to the first output signal.

4. The driver of claim 3, wherein the voltage transforming circuit comprises a first inductor electrically coupled with the voltage buffer circuit, and a second inductor electrically coupled with the power amplifier.

5. The driver of claim 4, wherein the turns ratio is a square root of a ratio of an inductance of the second inductor to an inductance of the first inductor.

6. The driver of claim 1, further comprising a coupling capacitor, the coupling capacitor has a first terminal electrically coupled with the voltage buffer circuit and a second terminal configured to receive a reversed phase signal.

7. The driver of claim 6, wherein the coupling capacitor is configured to stabilize the voltage buffer circuit.

8. The driver of claim 6, wherein the reversed phase signal is complementary to the first output signal, and a capacitance of the coupling capacitor is a second input capacitance of the voltage buffer circuit.

9. A driver, suitable for driving a power amplifier, wherein the driver comprises:
   a transistor, having a control terminal configured to receive an input signal, a first terminal configured to receive a reference voltage, and a second terminal configured to output a first output signal; and
   a transformer, electrically coupled with the second terminal of the transistor and the power amplifier, the transformer being configured to receive the first output signal and to output a second output signal to the power amplifier, wherein an equivalent inductance of the transformer and an input capacitance of the power amplifier are arranged to make the transistor have a voltage gain approximated to 1.

10. The driver of claim 9, wherein the input signal is smaller than the reference voltage to make the transistor operate in a linear region.

11. The driver of claim 9, wherein the transformer has a turns ratio, and the turns ratio is a ratio of the second output signal to the first output signal.

12. The driver of claim 11, wherein the transformer comprises a first inductor electrically coupled with the transistor, and a second inductor electrically coupled with the power amplifier.

13. The driver of claim 12, wherein the turns ratio is a square root of a ratio of inductances of the second inductor to the first inductor.

14. The driver of claim 9, further comprising a coupling capacitor, the coupling capacitor has a first terminal electrically coupled with the control terminal of the transistor and a second terminal configured to receive a reversed phase signal.

15. The driver of claim 14, wherein the coupling capacitor is configured to stabilize the transistor.

16. The driver of claim 14, wherein the reversed phase signal is complementary to the first output signal, and a capacitance of the coupling capacitor is a second input capacitance of the transistor.

17. A driver, suitable for driving a power amplifier, wherein the driver comprises:
   a first transistor, having a control terminal configured to receive a first input signal, a first terminal configured to receive a reference voltage, and a second terminal configured to output a first output signal;

a second transistor, having a control terminal configured to receive a second input signal, a first terminal configured to receive the reference voltage, and a second terminal configured to output a second output signal;

a first coupling capacitor, having a first terminal electrically coupled with the control terminal of the first transistor and a second terminal electrically coupled with the second terminal of the second transistor;

a second coupling capacitor, having a first terminal electrically coupled with the control terminal of the second transistor and a second terminal electrically coupled with the second terminal of the first transistor, wherein a capacitance of the first coupling capacitor is an input capacitance of the first transistor, and a capacitance of the second coupling capacitor is an input capacitance of the second transistor; and a transformer, electrically coupled with the second terminal of the first transistor, the second terminal of the second transistor and the power amplifier, the transformer being configured to output a third output signal to the power amplifier according to the first output signal and the second output signal, wherein an equivalent inductance of the transformer and an input capacitance of the power amplifier are arranged to make the first transistor and the second transistor have a voltage gain approximated to 1.

18. The driver of claim 17, wherein the first coupling capacitor and the second coupling capacitor are configured to stabilize the first transistor and the second transistor.

19. The driver of claim 17, wherein the second output signal is complementary to the first output signal.

20. The driver of claim 17, wherein the transformer comprises a first inductor electrically coupled with the second terminal of the first transistor, and the second terminal of the second transistor, and a second inductor electrically coupled with the power amplifier, wherein a turns ratio is a square root of a ratio of an inductance of the second inductor to an inductance of the first inductor.

* * * * *